(12) United States Patent
Chew et al.

(10) Patent No.: US 7,395,932 B2
(45) Date of Patent: Jul. 8, 2008

(54) CARRIER TAPE FOR ELECTRONIC COMPONENTS

(75) Inventors: Boon Kiat Chew, Singapore (SG); Chye Lin Toh, Singapore (SG); Ching Yun Tye, Singapore (SG); Lee Hua Alvin Seah, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/493,930

(22) Filed: Jul. 27, 2006

(65) Prior Publication Data
US 2007/0023931 A1 Feb. 1, 2007

Related U.S. Application Data

(63) Continuation of application No. PCT/IB2004/000210, filed on Jan. 29, 2004.

(51) Int. Cl.
*B65D 73/02* (2006.01)

(52) U.S. Cl. ..................... 206/714; 206/713

(58) Field of Classification Search ............... 206/701, 206/713–717, 390, 820
See application file for complete search history.

(56) References Cited

U.S. PATENT DOCUMENTS

| 5,076,427 A | * | 12/1991 | Thomson et al. ............ 206/714 |
| 5,361,901 A | | 11/1994 | Schenz et al. |
| 5,396,988 A | * | 3/1995 | Skrtic ........................ 206/714 |
| 6,102,210 A | * | 8/2000 | Mikami ...................... 206/714 |
| 6,723,585 B1 | | 4/2004 | Tu et al. |
| 7,021,467 B2 | * | 4/2006 | Agari ......................... 206/714 |

FOREIGN PATENT DOCUMENTS

| EP | 1264779 A1 | 12/2002 |
| JP | 08-058877 | 3/1996 |

* cited by examiner

Primary Examiner—J. Gregory Pickett
(74) Attorney, Agent, or Firm—Edell, Shapiro & Finnan, LLC

(57) ABSTRACT

A carrier tape for electrical components is provided comprising a tape having a length and a plurality of cavities along the length of the tape. Each cavity comprises inner side walls and a bottom surface and is capable of containing an electrical component.

13 Claims, 5 Drawing Sheets

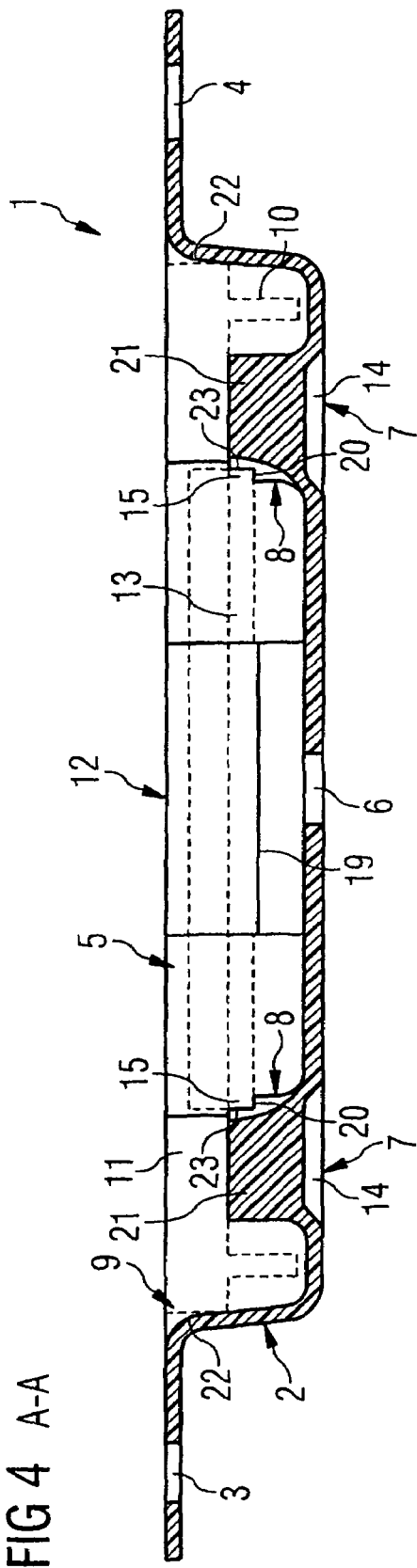
FIG 4 A-A

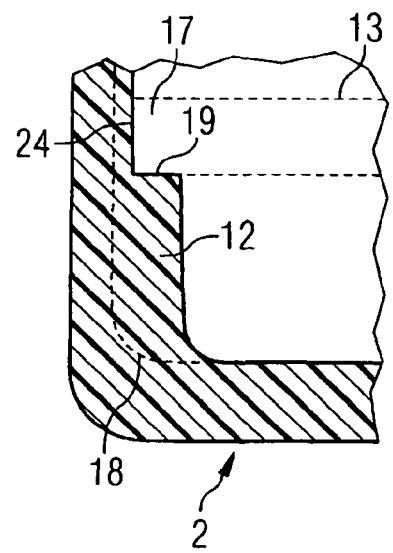
FIG 5 B-B
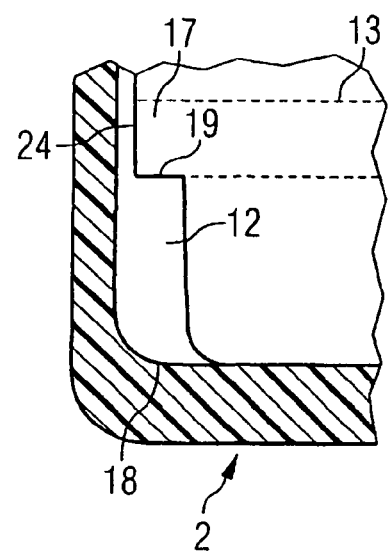
FIG 6 C-C
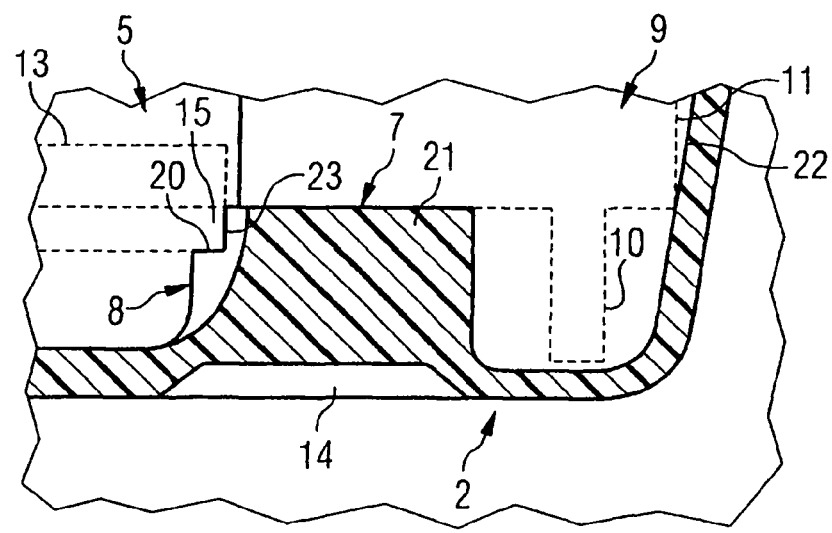
FIG 7 D-D

CARRIER TAPE FOR ELECTRONIC COMPONENTS

CROSS REFERENCE TO RELATED APPLICATIONS

This application is a continuation of PCT/IB2004/000210, filed Jan. 29, 2004, and titled "Carrier Tape for Electronic Components," the entire contents of which is hereby incorporated by reference.

BACKGROUND

The present invention relates to a carrier tape for electronic components.

European patent document EP 1 264 779 discloses a packing tape assembly which comprises a tape substrate with openings. A box, which is formed by folding paper, is inserted into each opening to create a receiving pocket for an electronic component.

Japanese patent document JP 8058877 discloses a carrier tape in which a cover strip is heat sealed to the carrier tape on one edge of the carrier tape and fixed by an openable fastener on the other edge of the carrier tape.

These carriers are very expensive and inconvenient for packing and transporting electronic components.

SUMMARY

Briefly, the present invention is directed to a carrier tape for electrical components comprising a tape having a length and a plurality of cavities along the length of the tape.

Each cavity comprises inner side walls and a bottom surface and is capable of containing an electrical component.

Embodiments of the invention will now be described by way of example with reference to the drawings.

BRIEF DESCRIPTION OF THE DRAWINGS

FIG. 4 shows the cross-sectional view A-A of the cavity of FIG. 1 according to an embodiment.

FIG. 5 shows the cross-sectional view B-B of the cavity of FIG. 1 according to an embodiment.

FIG. 6 shows the cross-sectional view C-C of the cavity of FIG. 1 according to an embodiment.

FIG. 7 shows the cross-sectional view D-D of the cavity of FIG. 1 according to an embodiment.

DETAILED DESCRIPTION

Figure 1:
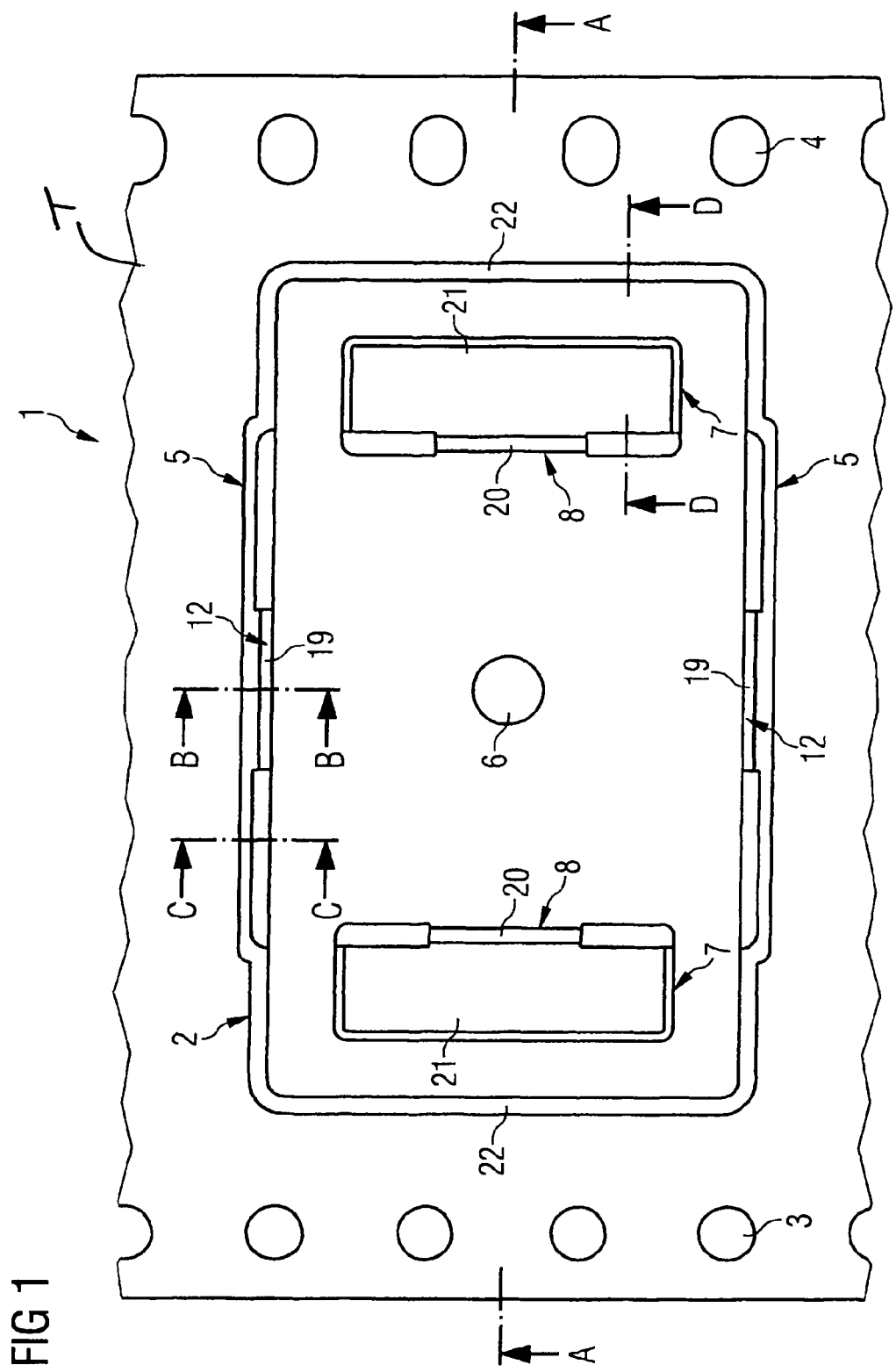
FIG. 1 shows a top view of a section of a carrier tape including a cavity for a semiconductor package according to an embodiment of the invention.

Reference is first made to FIG. 1 that shows a top view of a section of a carrier tape 1 according to an embodiment of the invention. The carrier tape 1 comprises a cavity 2 for semiconductor packages. The direction of the carrier tape 1 referred to as "longitudinal" in the description herein is depicted vertically in FIG. 1. The direction of the carrier tape 1 referred to as "lateral" in the description herein is depicted horizontally in FIG. 1.

The carrier tape 1 comprises a tape (body or sheet) T having a length, and plurality of cavities 2 arranged at intervals, such as constant intervals, along the length of the tape. The dimensions and the material properties of the carrier tape 1 and the spacing of the cavities 2 along the carrier tape 1 are chosen so as to comply with the relevant known industry standards.

According to an embodiment of the invention, the cavity 2 may be used to accommodate either an electronic component having first outer dimensions or an electronic component having second outer dimensions different from the first outer dimensions. The electronic components may comprise semiconductor packages. The carrier tape 1 according to the invention can be used for different electronic components or semiconductor packages with different outer dimensions that fit inside the cavities without being subjected to damage during transport. Thus, the same carrier tape can economically be used for many different types of electronic components or different types of semiconductor packages. This save costs and makes the packing and transportation process easier.

The carrier tape 1 comprises two columns of sprocket holes 3 and 4 positioned longitudinally, one column at each edge of the carrier tape 1. A first column of sprocket holes 3 having a circular cross-section or shape are positioned at a left hand edge and a second column of sprocket holes 4 having an essentially lozenge-shaped cross-section or oval shape are positioned towards the right hand edge of the carrier tape 1 in an orientation depicted in FIG. 1. The lateral width of the carrier tape 1 and the positioning and size of the sprocket holes 3, 4 are chosen so that the carrier tape 1 fits standard carrier tape reels or spools and machines and complies with the relevant known industry standards. The sprocket holes 3 and 4 allow the carrier tape 1 to be fed through automatic machines such as component pick and place machines. The electrical components may be placed into the cavities during the packing process automatically by machine and may be removed automatically from the cavities by machine when the components are to be put to use. It should be understood that the sprocket holes 3 and 4 may take on other types of shapes, so long as they are dissimilar, and can fit a carrier tape reel, spool or machine.

The cavity 2 may be located in the center of the carrier tape 1 and has an essentially rectangular shape in the plane of the carrier tape 1. The longer side of the rectangle is positioned laterally across the tape. The corners of the cavity 2 are rounded. Each of the two lateral sides of the cavity 2 comprises a recess 5 positioned approximately centrally in the lateral side wall and having a width of approximately two thirds of the lateral side of the cavity 2. The outer corners of the recess are rounded. The cavity 2 has longitudinal side walls 22. It should be understood that the cavity 2 need not be rectangular and may take on other shapes.

At the center of each recess 5 is a protruding portion 12. The protruding portion 12 protrudes into the cavity so that its inner wall is on approximately the same lateral line as the inner wall of the cavity 2 outside of the recess 5. The protruding portion 12 has, in the top view of FIG. 1, a rectangular shape and is located centrally in the recess 5. The lateral width of the protruding portion 12 is approximately one third of the lateral width of the recess 5. A circular hole 6 is located in the center of the bottom surface of the cavity 2. The protruding portion 12 may have a different shape and width, and the hole 6 need not be circular. Each protruding portion 12 has a ledge 19. The protruding portion 12 is described in more detail hereinafter in conjunction with FIG. 5.

The hole 6 enables a rod to be inserted from outside of the package to push the electrical component towards the top or above the top surface of the carrier tape 1 so that the component can be gripped by an unpacking machine. If the material of the carrier tape is sufficiently flexible, then a hole is not necessary because the carrier tape will deform when the rod is pushed against the outer surface of the bottom of the cavity allowing the force to be transferred to the component thereby raising it upwards. Furthermore, the hole may necessary if the gripping mechanism of the automatic machinery is capable of removing a component without forcing the component outward as described above.

The carrier tape 1 is suitable for a plurality of electrical components and comprises a cavity 2 for each electrical component. Each cavity 2 includes at least one elevated support. The elevated support may comprise an elevated island support member and/or an inner side wall of the cavity. As described in further detail hereinafter, the elevated island support member and the inner side wall elevated support member may comprise protruding portions that extend towards the center of the cavity 2.

The elevated support can be provided by one or more of a horizontal, vertical or inclined surface of an elevated island support member or of an inner side wall of the cavity. An electronic component may be supported in the cavity held in place or its movement restricted within the cavity by one or by a variety of different types of surfaces. The electronic components may be accommodated in the cavity in different ways depending on the position of the elevated supports and outer dimensions and external contact arrangement of the electrical component.

In one embodiment, the cavity 2 also comprises two elevated island supports (elevated island support members) 7 that extend from the bottom surface of the cavity 2. The elevated supports 7 are, as seen in the top view of FIG. 1, rectangular and arranged so that the long side is positioned and in the longitudinal direction of the carrier tape 1. The corners of each elevated support 7 are rounded. The inner longer side of each elevated support 7 includes a protruding portion 8 located approximately centrally along the inner longer side of the elevated support 7. The protruding portion 8 is, as seen in the top view of FIG. 1, rectangular with its long side in the longitudinal direction of the tape carrier 2. The length of the protruding portion 8 is approximately half the length of the long side of the elevated support 7. The elevated supports 7 and protruding portions 8 may take on different shapes and dimensions and need not be rectangular.

Each elevated support 7 is positioned within the cavity 2 towards the outer edge of the carrier tape 1 so that the distance between the outer sides of the elevated support 7 and the inner walls of the cavity 2 is approximately the same. The elevated supports 7 are positioned within the cavity 2 so that the inner longer sides of the elevated supports 7 are approximately laterally aligned with the inner corners recesses 5 of the cavity 2. Each elevated support 7 has an upper surface 21. Each protruding portion 8 has a ledge 20.

The same reference numbers are used in all of the Figures to denote the same features and are not necessarily described again in the description of each Figure.

Figure 2:
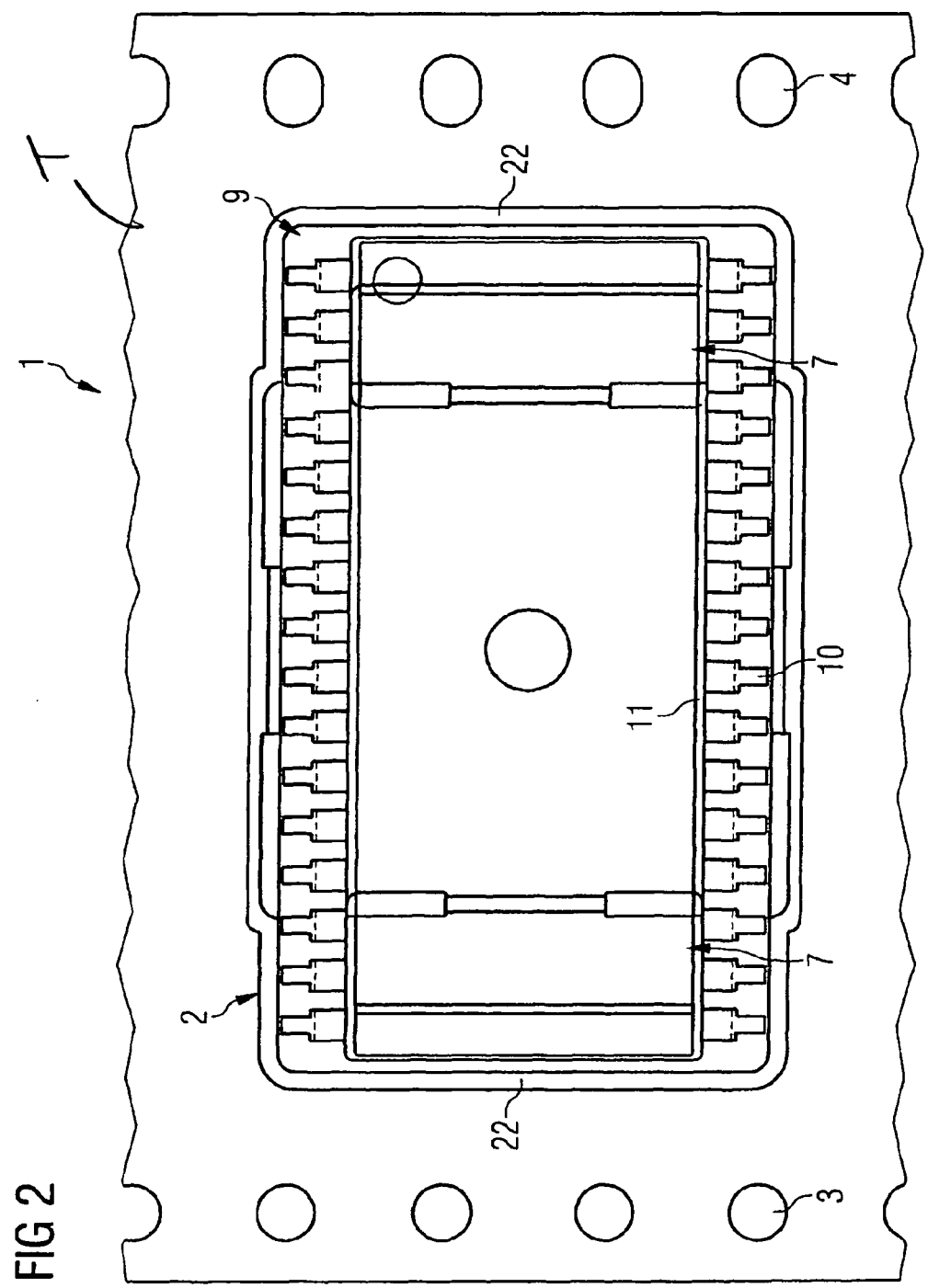
FIG. 2 shows a top view of the cavity of FIG. 1 including a leadframe semiconductor package according to an embodiment.

FIG. 2 shows a top view of the cavity 2 of the carrier tape 1 shown in FIG. 1 including a leadframe semiconductor package 9 within the cavity 2. The leadframe semiconductor package 9 is, when viewed from above the carrier tape 1, essentially rectangular and includes a plurality of leads 10 along its long sides. The leadframe package 9 fits within the cavity 2 so that its shorter sides are in close proximity to and partly abut the longitudinal sides 22 of the cavity 2 and the outer edges of the leads 10 are in close proximity with the long sides of the cavity 2. A package body 111 of the leadframe package 9 rests on the upper surface 21 of the elevated supports 7.

Figure 3:
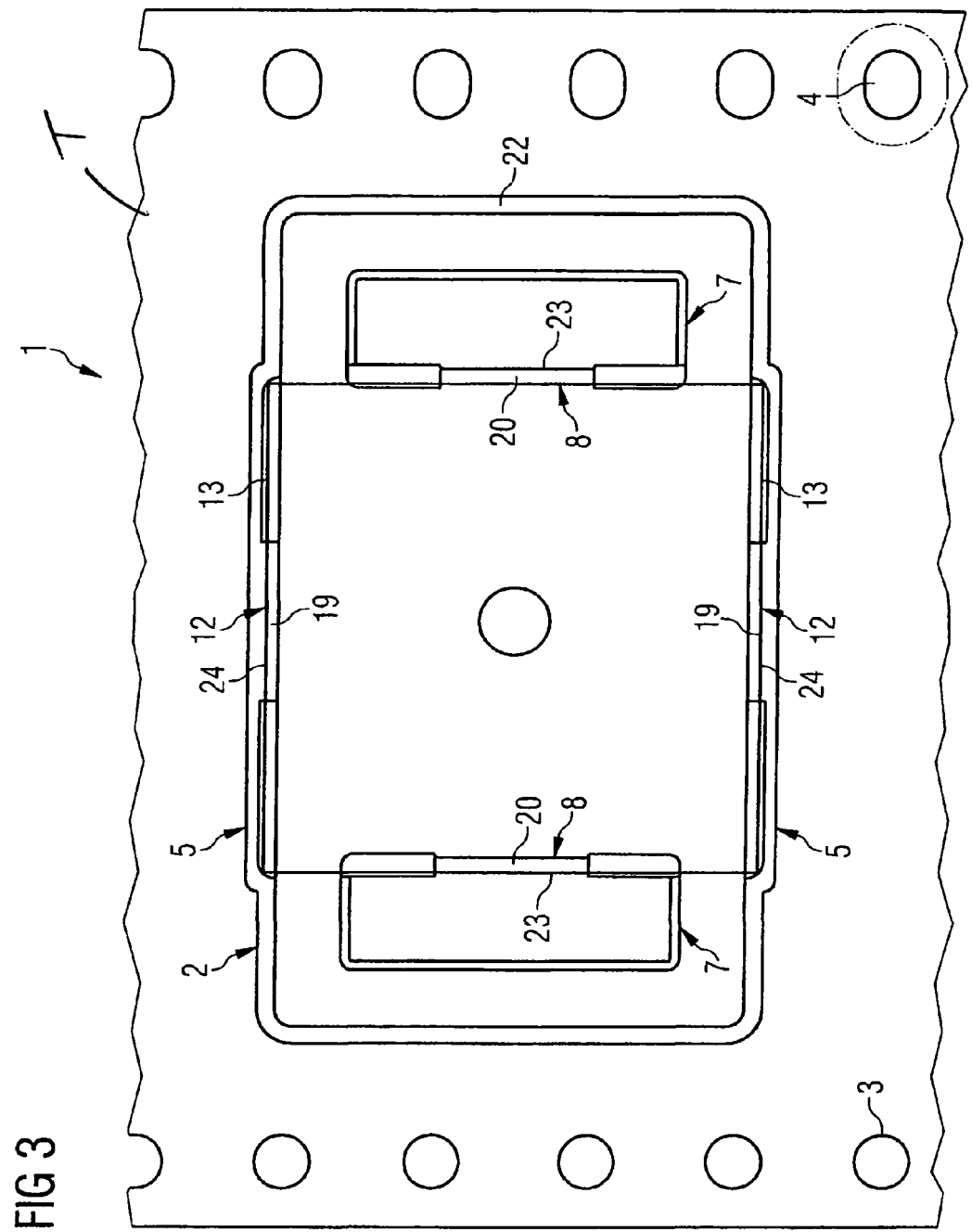
FIG. 3 shows a top view of the cavity of FIG. 1 including a laminate semiconductor package according to an embodiment.

FIG. 3 shows a top view of the cavity 2 including a laminate semiconductor package 13 within the cavity 2. The laminate semiconductor package 13 is, when viewed from the top of the carrier tape 1, essentially square and fits within the cavity 2 so that it rests on ledges 19 of the protruding portions 12 of the recesses 5 and on ledges 20 of the protruding portions 8 of the elevations 7. The corners of the laminated package 13 are in close proximity to the corners of the recesses 5.

FIG. 4 shows the cross-sectional view A-A of the cavity 2 of the carrier tape 1 shown in FIG. 1. The cross-sectional shape of the cavity 2, elevated supports 7 and the vertical positioning of two types of semiconductor package, a leadframe package 9 and a laminate package 13, are shown in FIG. 4. The cavity 2 may have an approximately rectangular cross-section and is slightly wider at the top than at the bottom. The cavity 2 may also be wider than it is deep. The outer dimensions of the cavity are chosen to comply with the relevant known industry standards. The edges and corners of the cavity 2 are rounded. Again, it is understood that the present invention is not limited to any of the particular shapes of the structural feature described herein and the shapes shown in the Figures and described herein are by way of example only.

Each elevated support 7 has an approximately square cross-section. A depression 14 in the material comprising the cavity bottom wall raises the central portion of the bottom surface of the elevated support 7 by approximately the width of the material comprising the cavity wall. A rectangular cutout 15 of the top inner corner of the protruding portion 8 of the elevated support 7 creates the ledge 20 and the vertical side wall 23 on the protruding portion 8 on the inner side of the elevated support 7. The ledge 20 is therefore positioned lower in the cavity than the top surface of the elevated support 7. The edges of the elevated support 7 where it joins the bottom surface of the cavity 2 may be rounded. The edges at the top surfaces and cutout 15 may be square.

The ledge 19 of the protruding portion 12 of the recess 5 may be at approximately the same height above the bottom of the cavity 2 as that of the protruding ledge 20 of the elevated support 7.

The dimensions of the ledges 19, 20 and their position within the cavity are chosen so as to accommodate the type of electronic component or semiconductor package which it is desired to pack in the cavity 2. The dimensions and position of the ledges 19, 20 are also chosen to comply with the relevant known industry standards.

The positions of two types of semiconductor packages within the cavity 2 are also shown in FIG. 4. The bottom surface of the laminate semiconductor package 13 rests on the ledge 20 of the elevated support 7 and on the ledge 19 of the protruding portion 12. The bottom portions of the side walls of the laminate package 13 abut the vertical surface 23 formed by the cutout 15 of the protruding portion 8 of the elevated support 7. The contact between the side walls of the laminate semiconductor package 13 and the vertical side wall 23 of the protruding portion 8 mainly holds the packages in place within the cavity 2. The top surface of the laminate package 13 may be lower than that of the upper surface of the carrier tape 1.

The bottom surface of the body 11 of the leadframe package 9 rests on the upper surface 21 of the elevated supports 7. The top surface of the body 11 of the leadframe package 9 lies on approximately the same plane as that as the top surface of the carrier tape 1. The side walls of the leadframe package 9 are in close proximity to the inner side walls 22 of the cavity 2 and the lower edge of the side wall abuts the side wall 22 of the cavity 2 mainly holding the leadframe package 9 in place in the cavity 2. The leads 10 of the leadframe package 9 are located in the space between the outer sides of the elevated support 7 and the inner walls 22 of the cavity 2.

FIG. 5 shows the cross-sectional view B-B of the cavity 2 of FIG. 1 according to an embodiment, and more clearly shows the protruding portion 12 of the recess 5 positioned in the longer lateral side of the cavity 2. The top inner edge of the protruding portion 12 includes a cutout 17 having a rectangular cross-section, the longer side of the cutout being vertical. This forms the ledge 19 and a vertical wall 24. The ledge has an upper surface that may be at the same height above the bottom of the cavity 2 as the ledge 20 of the protruding portion 8 of the elevated supports 7. The position of the inner wall of the recess 5 is indicated by a dotted line 18. The bottom surface of the laminate semiconductor package 13 rests on the ledge 19 and the outer side wall of the laminate package 13 abuts the vertical wall 24 formed by the cutout 17. The laminate semiconductor package 13 is mainly held within the cavity 2 by contact between its side walls and the vertical walls 23, 24 of the protruding portions 8 and 12. The bottom inner edge of the cavity 1 between the recess 5 and the floor of the cavity 2 may be rounded.

FIG. 6 shows the cross-sectional view C—C of the cavity 2 shown in FIG. 1 according to an embodiment. The inner wall of the recess 5 is shown by the solid line 18. The protruding portion 12 and ledge 19 formed by the cutout 17 protrude into the cavity 2. The laminate semiconductor package 13 rests on the ledge 19 and its vertical side wall abuts the outer vertical wall 24 formed by the cutout 17 of the protruding portion 12. The edge between the recess 5 and floor of the cavity 2 may be rounded.

FIG. 7 shows the cross-sectional view D-D of the cavity 2 shown in FIG. 1 according to an embodiment. The laminate semiconductor package 13 is shown resting on the ledge 20 formed by the cutout 15 of the top inner corner of the protruding portion 8 of the elevated support 7. The outer wall of the laminate semiconductor package 13 abuts the vertical side wall 23 of the protruding portion 8 of the elevated support 7 formed by the cutout 15. The body 11 of the leadframe semiconductor package 9 rests on the upper surface 21 of the elevated support 7. The outer side wall of the body 11 of the leadframe semiconductor package 9 is in close proximity to the inner side wall 22 of the cavity 2 and its lower edge abuts the side wall 22 of the cavity 2 so that the leadframe package 9 is held within the cavity 2. A lead 10 of the leadframe package 9 is shown located in the space between the outer wall of the elevated support 7 and the inner wall 22 of the cavity 2. The inner corners of the cavity and elevation 7 and the edges of the depression 14 of the elevation on the bottom outer surface of the cavity 2 may be rounded.

The tape T comprises a flexible electrically non-conducting material, such as a plastic, polymer, resin or paper-based materials or a composite based on one of these materials. The material is chosen so that the properties of the carrier tape 1 comply with the relevant known industry standards.

In use, an electronic component, for example a semiconductor package 9 or 13 is placed into a cavity 2 of the carrier tape 1. In normal operation a plurality of electronic components are packed into a plurality of cavities, with one component or package being placed in each cavity. The electronic components may all be of the same type or they may be of different types and/or may have different external dimensions. It is a particular advantage of the carrier tape 1 of the invention that two different types of semiconductor package 9, 13 may be packed into a single carrier tape 1 since the cavity 5 can accommodate either type of semiconductor package.

After the semiconductor packages 9, 13 have been placed in the cavities 2 of the carrier tape 1, a cover strip, which may comprise the same material as that of the carrier tape, is sealed over the top surface of the carrier tape 1. The sealing may be performed by the use of adhesives or by heat sealing the cover strip onto the carrier tape 1. These methods are known in the art. The cover strip further protects the semiconductor package 9, 13 from dust and dirt and also prevents the semiconductor package 9, 13 from falling out of the cavity 2 should it become dislodged. The carrier tape 1 containing the semiconductor packages with the cover strip sealed on the top surface is then wound onto a reel or spool for delivery to a customer.

Thus, to summarize, in one embodiment the elevated support may comprise an island member that extends from the bottom surface of the cavity. The elevated island support members are useful to accommodate a leadframe-based electrical component (semiconductor package) in the cavity. The body of the leadframe package rests on and is supported by upper surfaces of the elevated island support members. The leads of the leadframe package, which normally project downwards from the body of these types of packages, are accommodated inside the cavity without touching the bottom surface of the cavity. This is important as bending or damage to the leads of the semiconductor package could render the semiconductor part inoperable.

On the other hand, the sides of the electrical components that do not have leads are in close proximity or abut the inner side walls of the cavity. Alternatively, the sides of the electrical components that do not have leads may rest on ledges or protruding portions on the inner side walls of the cavity thereby preventing the electrical component from moving significantly during the subsequent assembly steps of the carrier tape or during transit of the reel to the customer.

Alternatively, the elevated supports comprise protruding portions that extend towards the center of the cavity from either or both of a pair of opposing side walls or from all four side walls (i.e., first and second pairs) of the cavity. The protruding portions may also include ledges. An electrical component may be supported on the protruding portions or ledges by only on two opposite sides. This arrangement has the advantage of being suitable for leadframe packages that have leads on two opposing sides of the package, as described above. Alternatively, the electrical component may be supported on four protruding portions or ledges, which has the advantage of greater support and restriction of movement of the electrical component.

The elevated supports in the form of ledges have the advantage that only edge portions of the component rests on the ledges. This is particularly desirable for components where the external contacts are located in the center of the bottom surface of the component, for example flip-chip semiconductor packages. The external contacts do not touch the elevated supports and/or bottom of the cavity, preventing damage to the external contacts of the component.

The cavity of the carrier tape of the invention may have a recess in each of a pair of opposing inner side walls to accommodate a first electronic component within the four outer corners of the two recesses and a second component of a different size or having different outer dimensions within the four corners of the cavity. The cavity may have rounded edges and corners and may be wider at the top near the opening to the cavity than at the bottom. This enables the components to be easily placed into and removed from the cavity. Thus, the inner side walls may be inclined outward (towards the top opening) or in other words inward towards the bottom surface of cavity. The inclined inner side walls of the cavity ensure contact with a bottom edge of an electrical component to secure (e.g., clamp) the component in place within the cavity. The elevated support may also be built on only two of the inner side walls (lateral side walls) or on all four inner side walls (longitudinal and lateral side walls) so that an electrical component is secured or clamped in the cavity between a first pair of opposing inner side walls or between first and second pairs of opposing inner side walls of the cavity depending on the size of the component.

The positions of the elevated supports enable components of different outer dimensions to be packed into the same carrier tape such that movement of the components within the cavity is minimized. The positions of elevated supports may vary to accommodate different electronic components to be packed in the carrier tape.

A semiconductor leadframe package may rest on the upper surfaces of the elevated supports and held in place by contact between at least the bottom edge of side walls of the leadframe package body and the inclined opposing inner side walls of the cavity. A laminate semiconductor package may rest on the ledges of the protruding portions and held in place by contact between the side walls of the laminate package and the side walls of the ledges of the protruding portions. Moreover, ledges of first and second elevated island support members support edges of an electrical component having first outer dimensions in or along a first direction between the first and second elevated island support members. And ledges of a first pair of opposing inner side walls of the cavity support edges of an electrical component having second outer dimension along or in a second direction between the first pair of opposing inner side walls, where the first direction is substantially perpendicular to the second direction as shown in FIGS. 1-3.

Thus, a single reel of carrier tape according to the embodiments described herein can be used for packing semiconductor packages that have different outer dimensions such as dual/multiple laminate and leadframe packages, for example. The expense and inconvenience of acquiring and stocking a range of custom sized carrier tapes for each type of electronic component is eliminated. The machine conversion time for running a new carrier tape for a new semiconductor package during the Mark Scan Pack (MSP) process is also advantageously reduced.

The carrier tape described according to the various embodiments herein may be used to contain electrical components, electronic components, semiconductor packages containing numerous electrical and/or electronic components, etc.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SIGNS 1 carrier tape
2 cavity
3 round sprocket hole
4 lozenge sprocket hole
5 recess
6 central hole
7 elevated support
8 protruding portion of elevated support 7
9 leadframe semiconductor package
10 lead fingers of leadframe package 9
11 body of leadframe package 9
12 protruding portion of recess 5
13 laminate semiconductor package
14 depression in bottom surface of elevated support 7
15 cutout of protruding portion 8
17 cutout of protruding portion 12
18 inner wall of recess 5
19 ledge of protruding portion 12
20 ledge of protruding portion 8
21 upper surface of elevated support 7
22 side walls of cavity 2
23 vertical wall of protruding portion 8
24 vertical wall of protruding portion 12
T tape, tape body, or tape sheet

What is claimed is:

1. A carrier tape for electrical components comprising:
a tape having a length; and
a plurality of cavities disposed along the length of the tape, each cavity being configured to contain either a first electrical component having first outer dimensions or a second electrical component having second outer dimensions and each cavity comprising:
a first pair of opposing inner side walls each of which comprises a ledge;
a bottom surface; and
first and second elevated island supports extending from the bottom surface of the cavity, each of the first and second elevated island supports comprising:
a ledge that is a horizontal surface and faces a center area of the cavity; and
an upper surface;
wherein the ledges of the first and second elevated island supports being configured to support the first electrical component and the upper surfaces being configured to support the second electrical component, the ledges of the first pair of inner side walls being configured to support a portion of the first electrical component and the ledges of the first pair of inner side walls and the ledges of the first and second elevated island supports being at approximately the same distance from said bottom surface.

2. The carrier tape of claim 1, wherein the first and second island supports each comprises one of: an island member that extends from the bottom surface of the cavity or a portion of one or more of the first pair of inner side walls.

3. The carrier tape of claim 1, wherein the first electrical component is a semiconductor package having the first outer dimensions and the second electrical component is a semiconductor package having the second outer dimensions.

4. The carrier tape of claim 3, wherein the ledges on the first and second elevated island supports support edges of the first electrical component having the first outer dimensions in a first direction between the first and second elevated island supports, and wherein upper surfaces of the first and second elevated island supports support the second electrical component having the second outer dimensions in a second direction between the first and second elevated island supports, wherein the first direction is substantially perpendicular to the second direction.

5. The carrier tape of claim 3, wherein the first and second elevated island supports each comprise a protruding portion that extends towards a center of the cavity and the ledges of the first and second elevated island support portions are formed on the protruding portions of the respective first and second elevated island supports.

6. The carrier tape of claim 3, wherein each of the first pair of opposing inner side walls comprises a protruding portion that extends toward the center of the cavity and the ledges of the first pair of opposing inner side walls are formed on the protruding portions of the respective opposing inner side walls.

7. The carrier tape of claim 1, wherein each of the first pair of opposing inner side walls further comprises a recess, and wherein the cavity is sized so as to contain either the first electrical component having first outer dimensions between corners of the recesses or to contain the second electrical component having second outer dimensions between corners of the cavity.

8. The carrier tape of claim 1, wherein the plurality of cavities are spaced at intervals along the length of the carrier tape, and further comprising at least one column of sprocket holes positioned near an edge of the carrier tape along the length thereof.

9. The carrier tape of claim 8, wherein each cavity further comprises a second pair of opposing inner side walls, and wherein the second pair of opposing inner side walls support a portion of the second electrical component having second outer dimensions extending there between.

10. The carrier tape of claim 9, wherein the first and second elevated island supports are positioned offset from the second pair of inner side walls.

11. The carrier tape of claim 9, further comprising a recess in a portion of each of the first pair of opposing inner side walls, wherein the cavity is configured to contain the first electrical component having first outer dimensions between corners of the recesses and configured to contain the second electrical component having second outer dimensions between corners of the cavity.

12. The carrier tape of claim 10, wherein a space between each of the first and second elevated island supports and the corresponding one of the second pair of opposing inner side walls is sized to accommodate a portion of the second electrical component having leads that extend from the second electrical component.

13. The carrier tape of claim 1, wherein the first electrical component is a laminate circuit package and the ledges of the first and second elevated island supports are configured to support the laminate circuit package, and the second electrical component is a leadframe circuit package and the upper surfaces of the first and second island supports are configured to support the leadframe circuit package.

* * * * *